(12) United States Patent
Kawasaki

(10) Patent No.: US 8,742,375 B2
(45) Date of Patent: Jun. 3, 2014

(54) SCANNING ELECTRON MICROSCOPE DEVICE, EVALUATION POINT GENERATING METHOD, AND PROGRAM

(75) Inventor: Takahiro Kawasaki, Omitama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 370 days.

(21) Appl. No.: 13/322,394

(22) PCT Filed: May 25, 2010

(86) PCT No.: PCT/JP2010/058823
§ 371 (c)(1),
(2), (4) Date: Nov. 23, 2011

(87) PCT Pub. No.: WO2010/137586
PCT Pub. Date: Dec. 2, 2010

(65) Prior Publication Data
US 2012/0104251 A1 May 3, 2012

(30) Foreign Application Priority Data
May 26, 2009 (JP) ................................ 2009-126939

(51) Int. Cl.
*H01J 37/26* (2006.01)
*G01N 23/00* (2006.01)
(52) U.S. Cl.
USPC ...... 250/492.22; 250/310; 250/311; 382/145; 382/149; 382/209
(58) Field of Classification Search
USPC ........... 250/306, 307, 310, 311, 491.1, 492.1, 250/492.2, 492.22, 492.23, 492.3; 382/145, 382/149, 209; 716/106, 107, 110, 11, 112, 716/136; 356/237.4, 237.5, 239.3
See application file for complete search history.

(56) References Cited

U.S. PATENT DOCUMENTS

| 7,365,322 B2 * | 4/2008 | Miyamoto et al. ............ 250/310 |
| 7,449,689 B2 * | 11/2008 | Nagatomo et al. ............ 250/310 |
| 8,139,845 B2 * | 3/2012 | Noguchi et al. ............. 382/145 |
| 2006/0108524 A1 * | 5/2006 | Nagatomo et al. ............ 250/310 |

(Continued)

FOREIGN PATENT DOCUMENTS

| JP | 04-184849 A | 7/1992 |
| JP | 05-226441 A | 9/1993 |

(Continued)

OTHER PUBLICATIONS

Japanese Office Action issued in Japanese Application No. 2009-126939, mailed Oct. 4, 2011.

*Primary Examiner* — Bernard E Souw
(74) *Attorney, Agent, or Firm* — McDermott Will & Emery LLP

(57) ABSTRACT

An image acquisition condition necessary to so arrange FOV's as not to overlap along a device shape so that all constituent arreas necessary for electric characteristic measurement may be confined in the FOV's is determined from device shape information (including circuit design data and layout design data) possessed by CAD data. Since, contingently upon the shape of a wiring portion, the wiring portion of a device is expressed by using a plurality of basic constituent figures in combination, a process of arranging FOV's to the individual constituent figures is executed. For a cell portion, a FOV is arranged in reference to a cell outer frame and apexes. At that time, any apex is a starting point of the FOV arrangement process and another apex is an end point of the same process.

9 Claims, 12 Drawing Sheets

(56) References Cited

U.S. PATENT DOCUMENTS

2006/0284081 A1* 12/2006 Miyamoto et al. ............ 250/307
2009/0110262 A1* 4/2009 Noguchi et al. ............... 382/145

FOREIGN PATENT DOCUMENTS

| | | |
|---|---|---|
| JP | 2000-236007 A | 8/2000 |
| JP | 2000-348658 A | 12/2000 |
| JP | 2002-328015 A | 11/2002 |
| JP | 2005-116795 A | 4/2005 |
| JP | 2006-351746 A | 12/2006 |
| JP | 2007-147366 A | 6/2007 |
| JP | 2007-250528 | 9/2007 |
| JP | 2007-250528 A | 9/2007 |

* cited by examiner

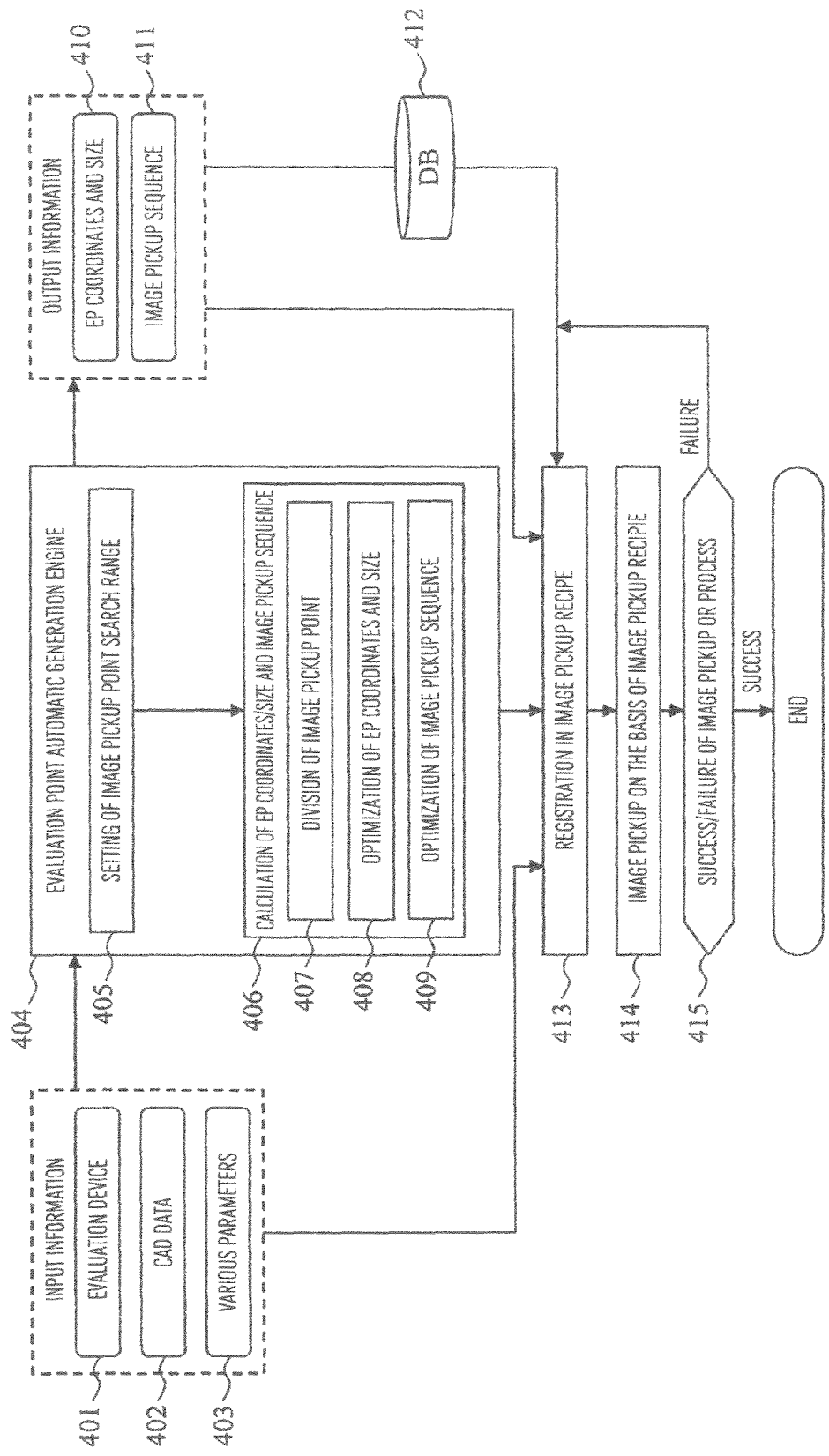

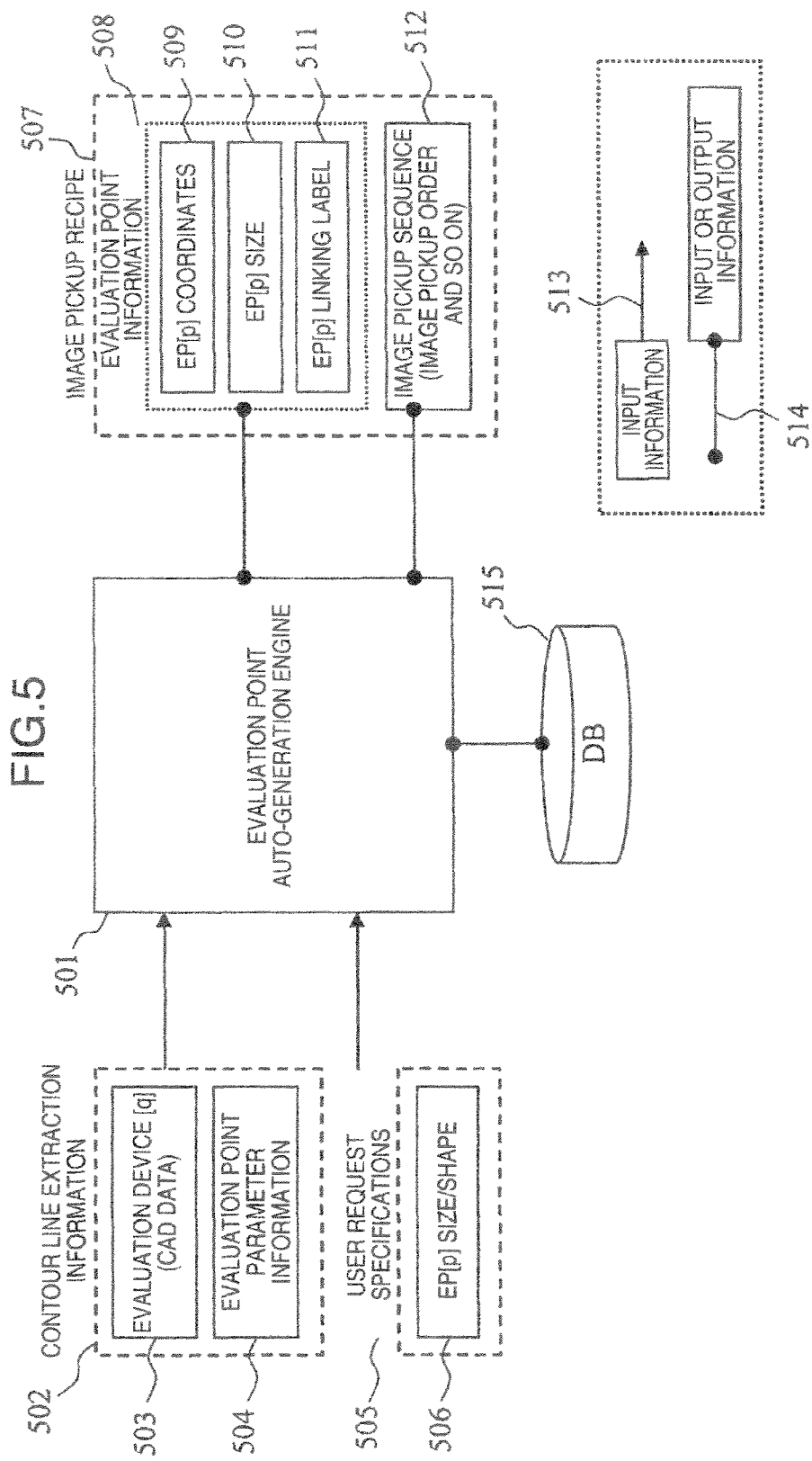

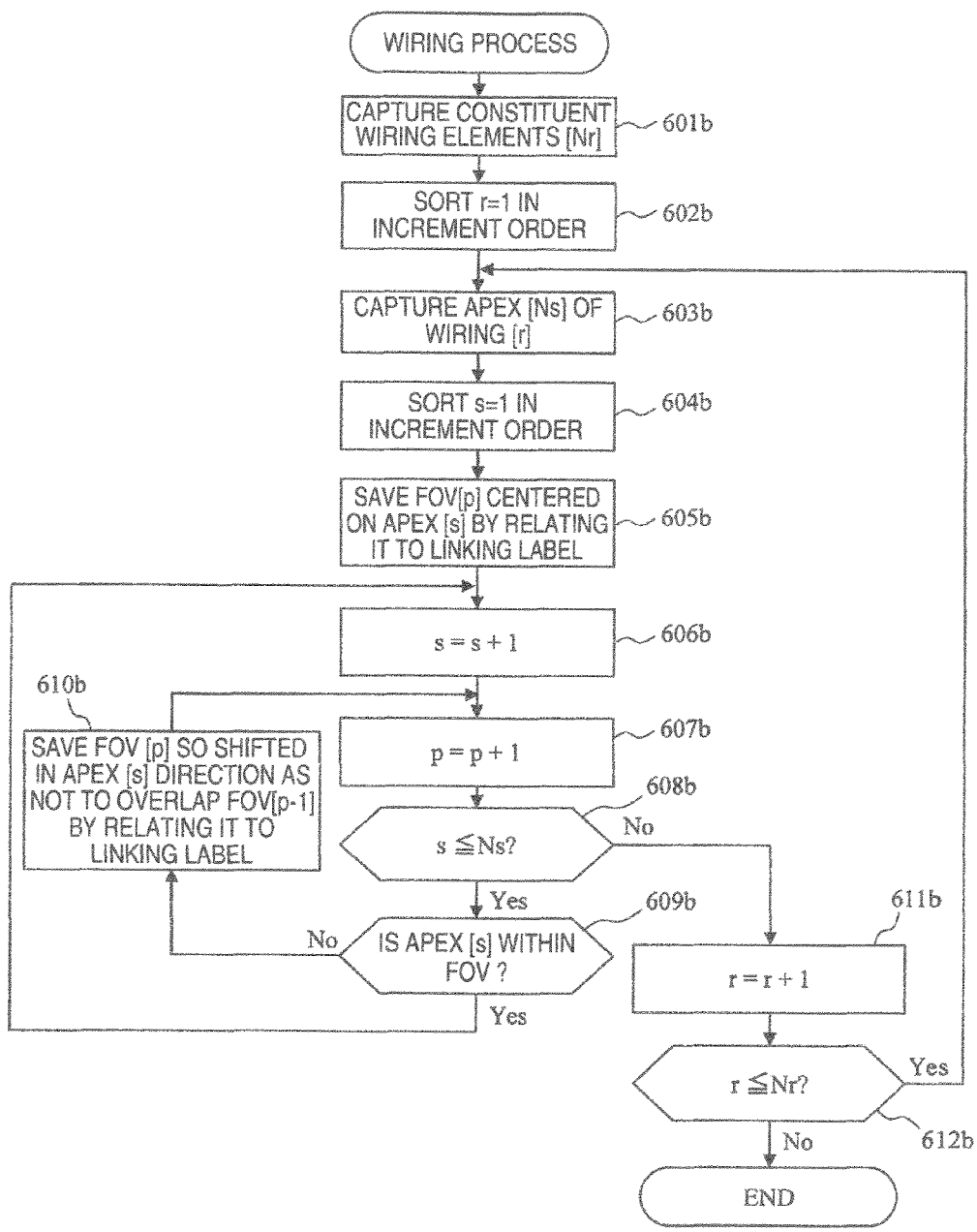

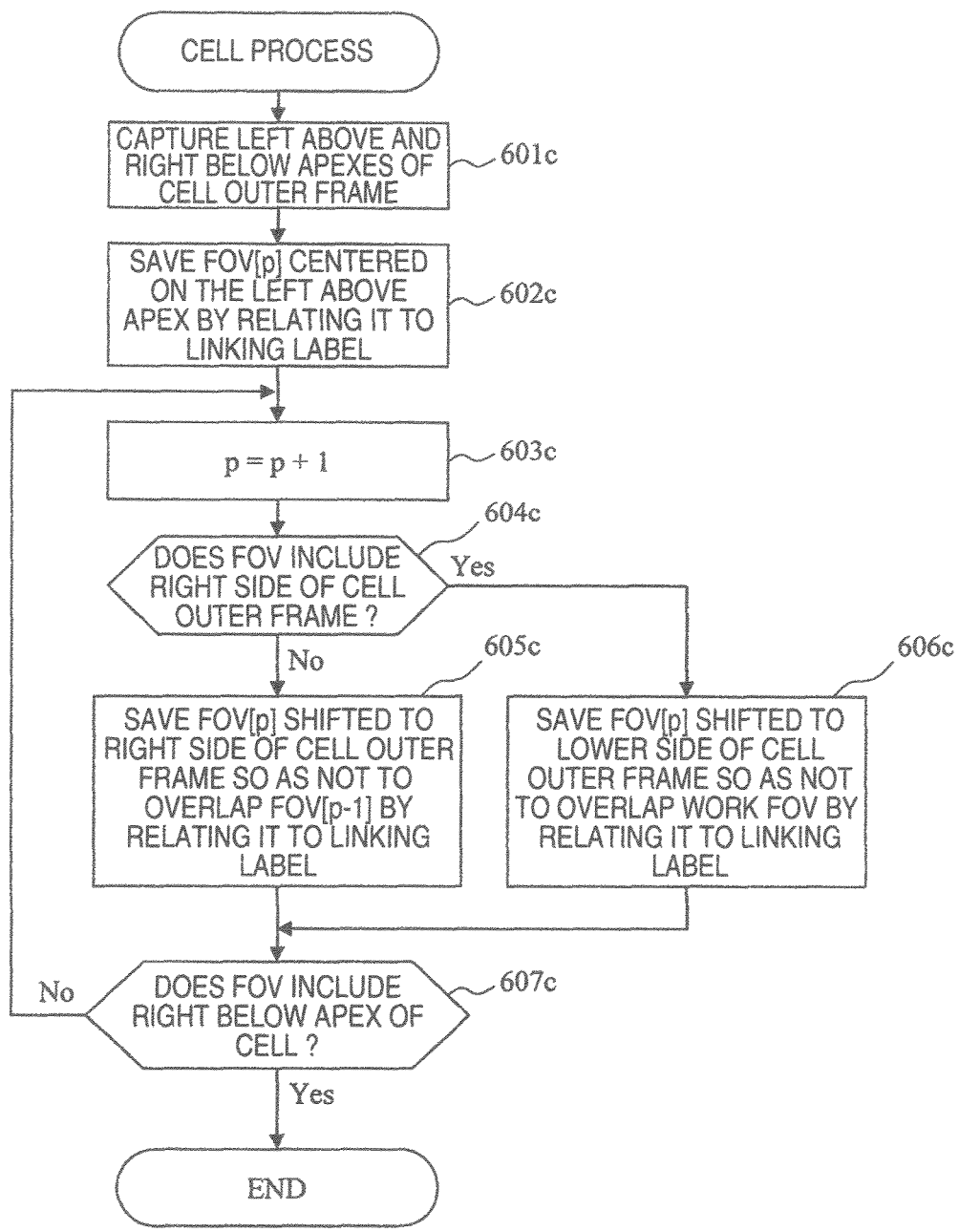

CONTOUR LINE
EXTRACTION
OBJECTIVE DEVICE

CONTOUR LINE
EXTRACTION
OBJECTIVE DEVICE

SCANNING ELECTRON MICROSCOPE DEVICE, EVALUATION POINT GENERATING METHOD, AND PROGRAM

This application is the U.S. National Phase under 35 U.S.C. §371 of International Application No. PCT/JP2010/058823, filed on May 25, 2010, which in turn claims the benefit of Japanese Application No. 2009-126939, filed on May 26, 2009, the disclosures of which Applications are incorporated by reference herein.

TECHNICAL FIELD

The present invention relates to generation of a recipe for performing measurement of a finished shape of a semiconductor device, especially, measurement of evaluation points by using a scanning electron microscope.

BACKGROUND ART

When forming a device or a wiring pattern in a semiconductor wafer, a method is adopted in which a coating substance called resist is coated on the semiconductor wafer, a light exposure mask of a pattern shape (reticule) is overlaid on the resist, and the resist is exposed to light by exposing such light as visual rays/ultraviolet rays from above the reticle, thus forming the pattern. The thus obtained pattern will change in its shape contingently upon the intensity of an irradiated electron beam or the aperture and therefore, for formation of a highly accurate pattern, the workmanship of the pattern needs to be inspected.

For inspection of such a pattern as above, a critical dimension scanning electron microscope (CD-SEM) has been used widely. In a pattern inspection based on the CD-SEM, an arbitrary evaluation point on a semiconductor pattern to be inspected is observed with the CD-SEM and a critical dimension of a width and shape data of the pattern as well are captured from an observed image to evaluate the workmanship of the pattern.

Incidentally, in order to evaluate the pattern shape by image-picking up the pattern on the wafer with the CD-SEM, it is necessary to prepare a recipe for designating the position, magnification and image quality of an evaluation point. The recipe has conventionally been prepared on the CD-SEM but a drastic increase in the number of evaluation points concomitant with recent highly dense integration of a semiconductor has recently been enabling automatic preparation of a recipe from CAD data to gain a mainstream method.

Further, in the field of recent up-to-date semiconductors, the process rule reaches a more minute critical dimension than the wavelength of an exposure light source. For this reason, during transfer of a pattern to a wafer, rays of light for nearby patterns interfere with each other through a phenomenon called OPE (Optical Proximity Effect), bringing about a problem that patterns different from those of the rectile are transferred onto the resist. To avoid this phenomenon, OPC (Optical Proximity Correction) of correcting a pattern to be transferred by adding to the mask a micro pattern for correction has been used generally. The effect of correction by the OPC pattern added to the layout pattern is verified principally with a litho-simulator, so that a critical spot at which the shape changes greatly differently during transfer to the wafer can be extracted automatically as a Hot Spot, a recipe can be generated automatically from the extracted Hot Spot and then, a pattern on the actual wafer can be measured to thereby conduct stringent verification of a finished shape.

Furthermore, the up-to-date lithography tends to adopt a so-called aggressive OPC (using a greater number of OPC patterns) as more intensive OPC (intensifying the degree of deformation of a pattern). In order to adopt the aggressive OPC, a flow of data is needed which is different from the data flow in the conventional rule base OPC. Then, outline data called contour data has become expected. With the contour data, not only the conventional Hot Spot measuring point but also the shape can be evaluated, permitting more accurate verification to be conducted (see Patent Literature 1, for instance).

CITATION LIST

Patent Literature

Patent Literature 1: JP-A-2007-250528
Patent Literature 2: JP-A-2000-348658
Patent Literature 3: JP-A-2002-328015

SUMMARY OF INVENTION

Technical Problem

However, in connection with transistors required of stringent pairing properties (less permissible margin) and a critical path having very high timing accuracy on a circuit, even if the shape seems to be finished at a level equivalent to CAD data, a variation in characteristics due to a very minute change in shape will possibly affect the operation of semiconductor adversely. Accordingly, in respect of the aforementioned parts, the automatic extraction of Hot Spot from a difference in finished shape is difficult to achieve and besides, verification of only the finished shape cannot make a decision as to the presence/absence of an influence upon the circuit operation. In this case, verification must be conducted through simulation of circuit characteristics. To this end, there needs a recipe for image-picking up shapes each in unit of device capable of undergoing simulation of electric characteristics by covering all of them and linking picked up images.

Incidentally, the automatic generation of image pickup recipe described in Patent Literature 1 fulfils the effect of measuring Hot Spots (MP points) (fulfils the effect in preparing a recipe for conducting measurement accurately point by point) but there is no proposal that the all spots of the device having electric characteristics are imaged and partial images picked up at respective FOV's are placed in linking condition.

On the other hand, finished shapes are imaged over the entire surface of chip and they are linked together, enabling the aforementioned problem to be solved but this is not practical in view of the time required for measurement. In addition, such information at a critical portion as the electric characteristics is not clarified in the fabrication phase but clarified in the design phase and the measuring portion can be designated by the upper phase designer but an expedient for transferring the information to the semiconductor inspector section has been unavailable. In other words, the position on design information does not correspond to the position on pattern layout information and once the design information is patterned, it is very difficult to decide from only the pattern whether the portion on the pattern is of wiring or a mere hole or groove.

Solution to Problem

The present invention was made in the light of situations as above and is to provide, for the purpose of verifying the finishing precision required for circuit operation, an image acquisition condition determining technique for easily determining a position where a FOV including a device having electric characteristics (that is, evaluation point (EP)) is to be arranged.

To solve the problem, according to the present invention, an image acquisition condition necessary to so arrange FOV's as not to overlap along a device shape so that all constituent areas necessary for electric characteristic measurement may be confined in the FOV's is determined from device shape information (including circuit design data and layout design data) possessed by CAD data. It will be appreciated that depending on the shape of a wiring portion, the wiring portion of a device is expressed by using a plurality of basic constituent figures in combination and therefore, a process of arranging FOV's to the individual constituent figures is executed. For a cell portion, a FOV is arranged in reference to a cell outline frame and apexes. At that time, any apex is a starting point of the FOV arrangement process and another apex is an end point of the same process.

More particularly, according to the present invention, a scanning electron microscope device is for irradiating an electron beam on an evaluation point on an evaluation device and capturing an image of the evaluation point and it comprises an input unit for inputting CAD data of the evaluation device, an evaluation point generation unit (evaluation point automatic generation engine) for determining an evaluation point of evaluation device on the basis of the CAD data and an output unit for outputting information of the evaluation point determined by the evaluation point generation unit. The evaluation point generation unit identifies a wiring portion and a cell portion on the evaluation device on the basis of the CAD data, determines a FOV (Field Of View) corresponding to the evaluation point in respect of the identified portion, and arranges the determined FOV at the identified portion. Identification of the wiring portion and cell portion is executed by collating circuit design data with layout design data, both included in the CAD data. The arranged FOV's are added with labels each indicating an order of image pickup procedures.

The scanning electron microscope further comprises a basic constituent figure database for storing a plurality of kinds of basic constituent figures constituting the device. In this case, by consulting the basic constituent figure database, the evaluation point generation unit extracts basic constituent figures the layout design data has and identifies, for a wiring portion, a plurality of apexes of basic constituent figures constituting the wiring portion. Then, the evaluation point generation unit determines a first apex and a second apex at which arrangement of FOV's starts and ends, respectively, in the basic constituent figures, and arranges the FOV's in a direction from the first apex (start point) to the second apex (end point) in such a manner that a mutually overlapping area of FOV's is minimized. It will be appreciated that when the wiring portion is constituted by a plurality of basic constituent figures, the evaluation point generation unit determines the first and second apexes in respect of each of the basic constituent figures and then arranges FOV's.

Also, in respect of a cell portion, the evaluation point generation unit identifies, from a cell contour, a start apex representing a FOV arrangement start point and an end apex representing a FOV arrangement end point and arranges FOV's in sequence from the start apex toward the end apex in such a manner that alternate FOV's do not overlap mutually.

Further features of the present invention will become apparent from the following best mode for carrying out the invention taken in conjunction with the accompanying drawings.

Advantageous Effects of Invention

According to the present invention, FOV's for picking up images of all device portions having electric characteristics can be set efficiently and in consequence, highly accurate measurements can be realized efficiently.

The present invention pertains to a technique, according to which in respect of a device that is unknown, from only the layout design information, as to its portion where it has electric characteristics, the portion having electric characteristics is identified and FOV's can be arranged efficiently (without causing an overlapping part as far as possible) at the portion. For example, in the invention, by using device constituent information and linking information possessed by the semiconductor design data prepared by using an EDA (Electronic Design Automation) tool, a recipe including patterns on semiconductor device necessary for verification of electric characteristics (evaluation points) is generated automatically.

Embodiments of the present invention will now be described with reference to the accompanying drawings. It should however be noted that the present embodiment is a mere example of realizing the present invention and does not limit the technical scope of the invention.

BRIEF DESCRIPTION OF DRAWINGS

FIG. 4 is a flowchart for explaining an automatic generation process (whole) of an evaluation point automatic generation engine.

FIG. 5 is a diagram showing a list of input/output information of the evaluation point automatic generation engine.

FIG. 6B is a flowchart for explaining a process of allotting FOV's to wiring devices.

FIG. 6C is a flowchart for explaining a process of allotting FOV's to cell devices.

DESCRIPTION OF EMBODIMENTS

<Construction of Scanning Electron Microscope>

Figure 1:
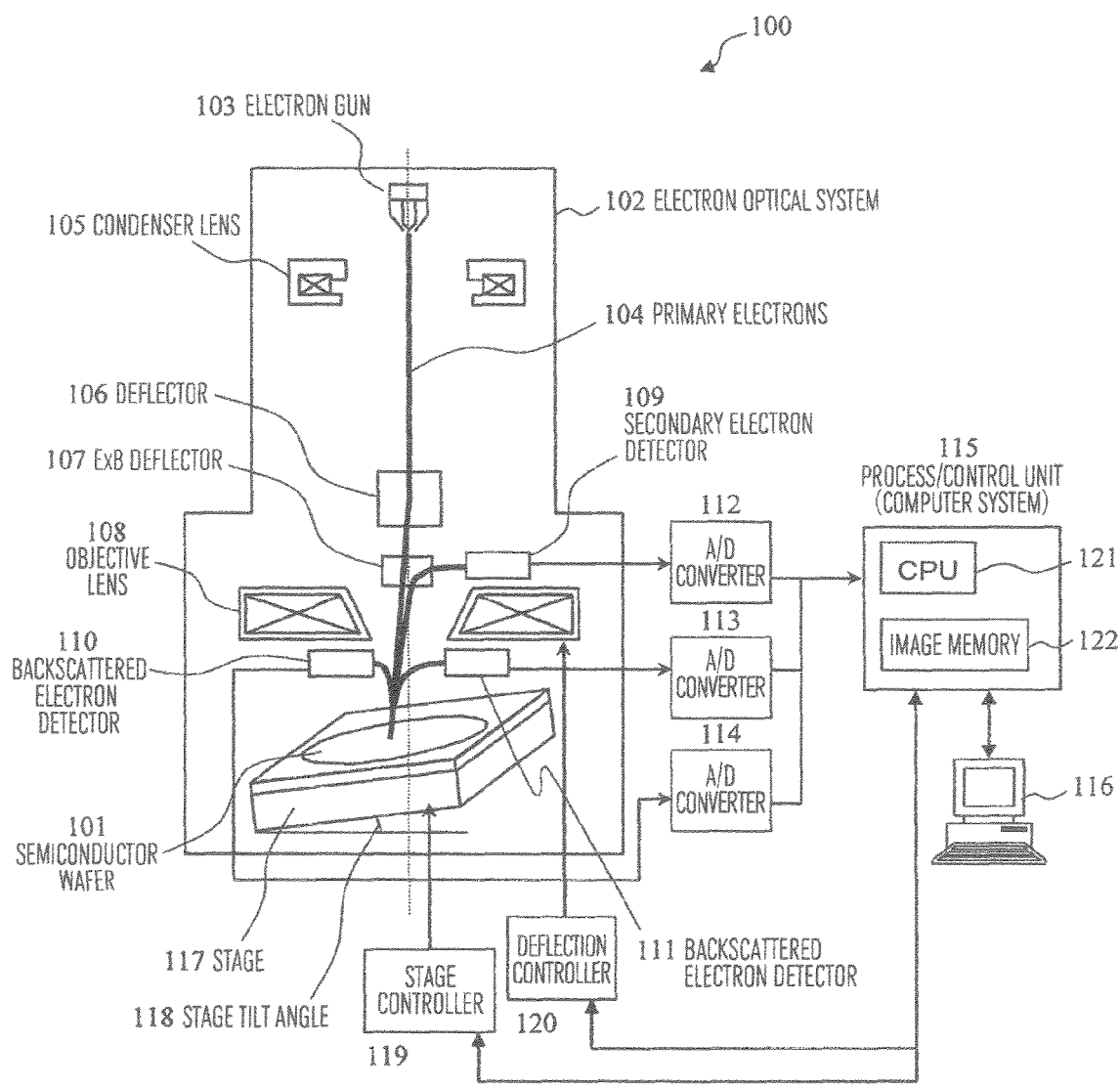
FIG. 1 is a diagram showing schematic construction of a scanning electron microscope (SEM) according to the present invention.

FIG. 1 is a block diagram illustrating schematic construction of a scanning electron microscope (SEM) for capturing a secondary electron image (SE image) or a backscattered electron image (BSE image) of a sample according to an embodiment of the present invention. It is to be noted that the SE image and the BSE image will hereinafter be generally called an SEM image. Then, it is assumed that the image captured here includes part or all of a top/down image obtained by observing a measuring objective in vertical direction and a tilt image obtained when the measuring objective is observed in a direction at an arbitrary inclination angle.

In FIG. 1, 103 designates an electron gun adapted to generate an electron beam 104. In order that the electron beam is focused and irradiated on a desired position on a semiconductor wafer 101 representing a sample mounted on a stage 117, the landing position of electron beam and an aperture therefore are controlled by means of a deflector 106 and an objective lens 108.

From the semiconductor wafer 101 irradiated with the electron beam, secondary electrons and backscattered electrons are discharged and the secondary electrons deviating from the trajectory of landing electron beam with the help of an E×B deflector 107 are detected with a secondary electron detector 109. On the other hand, the backscattered electrons are detected with backscattered electron detectors 110 and 111. The backscattered electron detectors 110 and 111 are arranged in directions different to each other. The secondary electrons detected with the secondary electron detector 109 and the backscattered electrons detected with the backscattered electron detectors 110 and 111 are converted into digital signals by means of A/D converters 112 through 114 and are then stored as image data in an image memory 122. Thereafter, a CPU 121 executes the image processing concordant with purposes to apply it to the image data stored in the image memory 122.

Figure 2A:
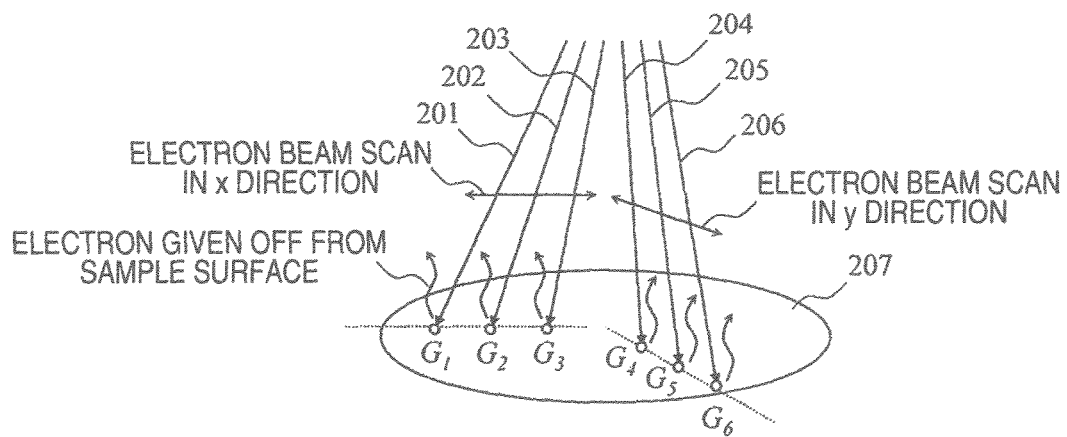
FIG. 2A is a diagram for explaining a status in which an electron beam is irradiated on a semiconductor wafer.
Figure 2B:
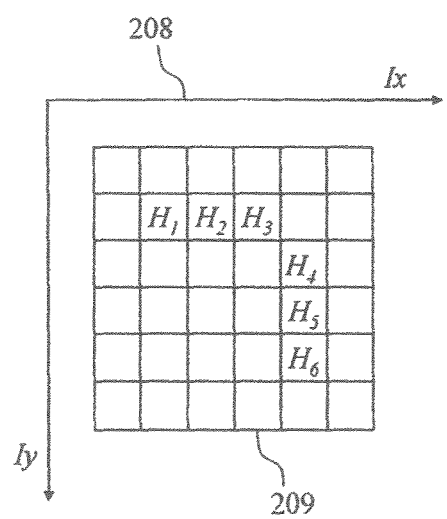
FIG. 2B is a diagram showing a status of individual pixels of an image illustrative of detection of electrons discharged from the semiconductor wafer under irradiation of electron beam.

FIGS. 2A and 2B are diagrams showing a method for imaging the signal amounts of electrons given off from the surface of semiconductor wafer 207 when the electron beam scans and irradiates on the semiconductor wafer. As shown in FIG. 2A, the electron beam is irradiated while being scanned in, for example, x direction as indicated by 201 to 203 or y direction as indicated by 204 to 206. By changing the deflection direction of the electron beam, the scanning direction can be changed. In FIG. 2A, spots at which electron beams 201 to 203 being scanned in x direction land on the semiconductor wafer are indicated by $G_1$, $G_2$, and $G_3$, respectively, and similarly, spots at which electron beams 204 to 206 being scanned in y direction land on the semiconductor wafer are indicated by $G_4$, $G_5$ and $G_6$, respectively. Signal amounts of electrons discharged at the landing positions $G_1$ to $G_6$, respectively, take a brightness value of 5 of pixels $H_1$ to $H_6$ (right below affixes to G correspond to those to H). Designated by 208 is a coordinate system indicating x and y directions on the image.

Reverting to FIG. 1, a description will continue. A computer system (process/control unit) 115 carries out, for the purpose of picking up an image pickup point on the basis of an image pickup recipe, such process/control as a process for sending control signals to a stage controller 119 and a deflection controller 120 or a process for applying various kinds of imaging to a picked up image at a desired image pickup point on the semiconductor wafer 101. The image pickup point referred to herein includes all or part of AP (Addressing Point), AFC (Auto Focus Point), AST (Auto Stigma Point), ABCC (Auto Brightness Contrast Point) and EP (Evaluation Point). The computer system (process/control unit) 115 is also connected to a display 116, thus providing a GUI (Graphic User Interface) adapted to give a display of images to the user.

The XY stage 117 moves the semiconductor wafer 101 to enable an image to be picked up at an arbitrary position on the semiconductor wafer. Hereinafter, changing the observation position by means of the XY stage 117 will be called stage shift and changing the observation position by deflecting the electron beam with the help of the deflector 106 will be called beam shift. Generally, the stage shift has such a property that the movable range is wide but the accuracy of positioning an image pickup position is low and conversely, the beam shift has such a property that the movable range is narrow but the image pickup position positioning accuracy is high.

While FIG. 1 showing the example having two detectors for a backscattered electron image, the number of the backscattered electron image detectors can be decreased or increased.

Further, the aforementioned computer system (process/control unit) 115 generates an image pickup recipe through a method to be described later and picks up an image by controlling the SEM device on the basis of the image pickup recipe but part or all of the process/control can be allotted to plural different process terminals to deal with the process/control. Details of the image pickup sequence will be described later by using FIGS. 3A and 3B.

To obtain a tilt image resulting from observing a measuring objective in a direction at an arbitrary inclination angle by using the scanning electron microscope device shown in FIG. 1, there are available (i) a method of image-picking up a tilt image by deflecting the electron beam illuminating from an electron optical system to incline the landing angle of the electron beam (see Patent Literature 2, for instance), (ii) a method of inclining the stage 117 per se adapted to move the semiconductor wafer (in FIG. 1, the stage is tilted through a tilt angle 118) and (iii) a method of inclining the electron optical system per se mechanically.

<As to SEM Image Pickup Sequence>

Figure 3A:
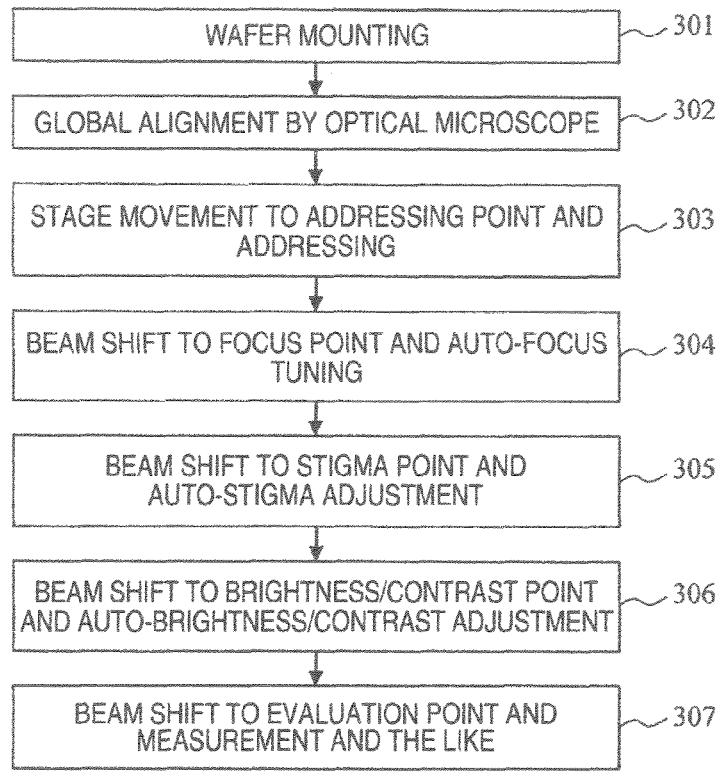
FIG. 3A is a flowchart showing the image pickup sequence by the SEM.

FIG. 3A is a diagram showing a typical image pickup sequence for observation of an arbitrary EP. Image pickup point, image pickup order and image pickup condition in the image pickup sequence are designated by an image pickup recipe.

Firstly, in step 301 in FIG. 3A, the semiconductor wafer representing a sample is attached onto the stage 117 of SEM device. Then, in step 302, a global alignment mark on the wafer is observed with an optical microscope or the like and by using the result of observation, origin drift and rotation of the wafer are corrected.

In step 303, the process/control unit 115 moves the stage 117 on the basis of the image pickup recipe to move the image pickup position to an AP to proceed with image pickup thereat, determines a parameter of addressing, and carries out addressing in accordance with thus determined parameter.

Here, an additional explanation will be given to the AP. If, in the case of observation of an EP, direct observation of the EP is to be carried out by stage shift, a large drift of an image pickup point will possibly occur adversely, depending upon the accuracy of positioning the stage. Accordingly, an AP given in advance with a coordinate value of the image pickup point and a template (a pattern of image pickup point) as well for the sake of positioning is once observed. The template is registered in the recipe and so, will hereinafter be called a register template. The AP is selected from the nearby neighborhood (a range within which movement by beam shift is possible at the most). Then, the AP is generally at a lower magnification field of view than the EP and so the pattern desired to be image-picked up will hardly be outside the field of view concomitantly with a slight image pickup position shift. Accordingly, by matching the precedently registered AP register template with an actually picked up SEM image of the AP (actual image pickup template), an amount of position displacement at the image pickup point in the AP can be presumed.

Since coordinate values of AP and EP are already known, a relative displacement amount between AP and EP can be determined and besides, an amount of positional displacement of the image pickup point in the AP can be presumed by aforementioned matching. Accordingly, by subtracting the positional displacement amount from the relative displacement amount between AP and EP, an amount of relative displacement by a movement to be effected actually from the AP image pickup position to the EP can be known. This ensures that the EP can be image-picked up with a high coordinate accuracy by proceeding with movement by the relative displacement amount according to the beam shift of high positioning accuracy.

In order to make this possible, the AP to be registered is desired to satisfy such conditions that (i) it is a pattern being apart from the EP by a distance over which the beam shift is possible (besides, a condition may sometimes be added according to which, with a view to suppressing generation of contamination at the EP, an FOV at the time of EP image pickup is not included within the range of AP image pickup: Field of View; FOV=EP), that (ii) the image pickup magnification for AP is lower than that for EP in consideration of the accuracy of stage positioning and that (iii) the pattern shape or bright pattern is characteristic and the matching of the register template with the actual image pickup template can be facilitated. In making a decision as to which spot is selected as an AP, this was done manually by the SEM operator in the past but conversely, satisfactory selection of the AP and determination of the image pickup sequence can advantageously be conducted automatically.

To avoid image pickup from being carried out for only registration of CAD image, SEM image or image template, an expedient of variation can be considered for the image template at the AP to be registered, according to which it is once registered as CAD data and an SEM image of AP obtained during actual image pickup is registered again as an SEM image template (see Patent Literature 3, for instance).

To add, the aforementioned AP selection range will be supplemented. Generally, the electron beam vertical incident coordinate is set at the center coordinate of EP and so the selection range of AP is set at the most to a beam shift movable range centered on the EP but when the electron beam vertical incident coordinate differs from the center coordinate of EP, the beam shift movable range from the electron beam vertical incident coordinate becomes a selection range. Further, depending upon an allowable electron beam incident angle required for an image pickup point, the search range from the electron beam vertical incident coordinate will sometimes become also narrower than the beam shift movable range. These hold true for other templates.

Reverting to FIG. 3A, an explanation will continue. In step 304, the process/control unit 115 moves, through beam shift, the image pickup position to AF on the basis of the image pickup recipe to proceed with image pickup, determines a parameter of auto-focus tuning and executes auto-focus tuning with the thus determined parameter.

Here, an additional explanation will be given to the AF. During image pickup, the auto-focus proceeds in order to capture a sharp and clear image but with the electron beam irradiated on the sample for a long time, a contaminant substance will be deposited on the sample. Accordingly, for the purpose of suppressing the deposition of contamination at the EP, an expedient is taken, according to which a coordinate around the EP is once observed as AF, a parameter of the auto-focus is determined and thereafter, the EP is observed on the basis of the thus determined parameter.

To this end, the AF to be registered is desired to satisfy such conditions that (i) it is a pattern being apart from the AP and EP by a distance over which the beam shift is possible and besides an FOV at the time of AF image pickup does not include an FOV at the time of EP image pickup, that (ii) the image pickup magnification for AF is substantially identical to that at the time of EP image pickup (but, this holds for the case of the AF being for EP and in the case of the AF for AP, the AF is imaged at an image pickup magnification substantially identical to that for the AP. This applies similarly to AST and ABCC to be described later) and that (iii) the pattern shape of the AF is easy to be auto-focused (a blur of image due to defocus can be detected with ease).

Next, in step 305, the process/control unit 115 moves the image pickup position to the AST through beam shift to proceed with image pickup, determines a parameter of auto-stigma adjustment and executes an auto-stigma adjustment by using the thus determined parameter.

Here, an additional explanation will be given to the AST. During image pickup, the astigmatism correction proceeds in order to capture a less deformed image but like the AF, with the electron beam irradiated on the sample for a long time, a contaminant substance will be deposited on the sample. Accordingly, for the purpose of suppressing the deposition of contamination at the EP, an expedient is taken, according to which a coordinate around the EP is once observed as AST, a parameter of the astigmatism correction is determined and thereafter, the EP is observed on the basis of the thus determined parameter.

To this end, the AST to be registered is desired to satisfy such conditions that (i) it is a pattern being apart from the AP and EP by a distance over which the beam shift movement is possible and besides a FOV at the time of AST image pickup does not include a FOV at the time of EP image pickup, that (ii) the image pickup magnification for AST is substantially identical to that at the time of EP image pickup and that (iii) the pattern shape of the AST is easy to undergo the astigmatism correction (a blur of image due to astigmatism can be detected with ease).

Subsequently, in step 306, the process/control unit 115 moves the image pickup position to the ABCC through beam shift to proceed with image pickup, determines a parameter of brightness/contrast adjustment and executes an auto-brightness/contrast adjustment by using the thus determined parameter.

Here, an additional explanation will be given to the ABCC. During image pickup, in order to capture a sharp image having proper brightness value and contrast, a portion at the highest image signal and a portion at the lowest image signal, for example, are set to full contrast or nearly full contrast by adjusting a parameter such as voltage of a photomultiplier (photomultiplier tube) in, for example, the secondary electron detector 109. But like the AF, with the electron beam irradiated on the sample for a long time, a contaminant substance will be deposited on the sample. Accordingly, for the purpose of suppressing the deposition of contamination at the EP, an expedient is taken, according to which a coordinate around the EP is once observed as ABCC, a parameter of the brightness/contrast adjustment is determined and thereafter, the EP is observed on the basis of the thus determined parameter.

To this end, the ABCC to be registered is desired to satisfy such conditions that (i) it is a pattern being apart from the AP and EP by a distance over which the beam shift movement is possible and besides a FOV at the time of ABCC image pickup does not include a FOV at the time of EP image pickup, that (ii) the image pickup magnification for ABCC is substantially identical to that at the time of EP image pickup and that (iii) in order that the brightness and contrast of an image picked up at a critical dimension measuring point by using the parameter adjusted at ABCC can be satisfactory, the ABCC has a pattern similar to the pattern at the critical dimension measuring point.

To add, picking up images of AP, AF, AST and ABCC in the previously described steps 303 through 306 can be subjected to various variations wherein part or all of them are omitted, the order of 303 through 306 can be exchanged arbitrary or some of coordinate values of AP, AF, AST and ABCC duplicate (for example, the auto-focus and auto-stigma are carried out at identical spot).

Finally, in step 307, the process/control unit 115 moves the image pickup point to the EP through beam shift to proceed with image pick up, and executes critical dimension measurement of the pattern under the set condition of critical dimension measurement. At the EP, too, matching the picked up SEM image with a register template corresponding to EP position registered in advance in the image pickup recipe will sometimes be carried out to detect a drift in measuring position. The image pickup recipe is written with information such as coordinate values, image pickup sequence and image pickup conditions of the aforementioned image pickup points (EP, AP, AF, AST, ABCC), and the SEM observes the EP on the basis of the image pickup recipe.

Figure 3B:
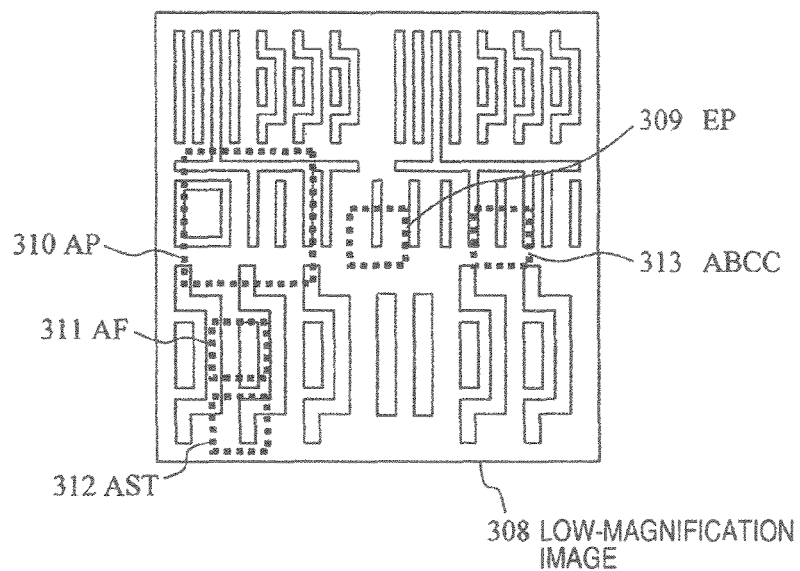
FIG. 3B is a diagram showing an example of various FOV positions on a low-magnification image.

FIG. 3B diagrammatically illustrates an example of positions of templates of EP 309, AP 310, AF 311, AST 312 and ABCC 313 on a low-magnification image 308. Individual points are illustrated at dotted-line frames.

<As to Image Pickup Recipe>

When forming wiring patterns in a semiconductor wafer, a method is adopted in which a coating substance called resist is coated on the semiconductor wafer, a light exposure mask of a pattern (reticule) is overlaid on the resist and the resist is exposed to light by irradiating visual light rays/ultraviolet rays or an electron beam from above the reticle, thus forming the wiring pattern. The thus obtained wiring pattern will change in pattern shape contingently upon the intensity of irradiated visual light rays/ultraviolet rays or of electron beam or the aperture and therefore, for formation of a highly accurate wiring pattern, the workmanship of the pattern needs to be inspected.

For the measurement, a critical dimension scanning electron microscope (CD-SEM) has been used widely. A critical point on a semiconductor pattern to be measured is set as an evaluation point (called, hereinafter, EP) and observed with the SEM, various critical dimensional values, as represented by a wiring width of pattern, are measured from the observed image and the workmanship of the pattern is evaluated from these critical dimensional values.

In order that the EP can be image-picked up without a positional drift but with high picture quality, part or all of the AP, AFP, ASP and ABCC are set as image pickup points as described previously and at each image pickup point, addressing, auto-focus tuning, auto-stigma adjustment and auto-brightness/contrast adjustment are carried out.

For an image pickup position drift amount during addressing, matching an SEM image at an AP of known coordinate value registered in advance as a register template with an SEM image observed in actual image pickup sequence (actual image pickup template) is conducted and a drift value obtained through this matching is presumed as the positional drift value. The EP, AP, AFC, AST and ABCC are generally called image pickup points, and coordinate/size/shape of a point included in part or all of the image pickup points, the image pickup sequence/image pickup condition and the register template as well are managed as an image pickup recipe.

Conventionally, the image pickup recipe was generated manually by the SEM operator through very laborious and time consuming working. Also, for determining individual image pickup points and registering the register template in the image pickup recipe, the wafer must be imaged actually at a low magnification and so, the generation of the image pickup recipe has led to a cause of reducing the operability of the SEM. Further, as the pattern has become corpuscular, an OPC (Optical Proximity Correction) technique has been introduced and the number of EP's requiring evaluation has been increasing drastically. For these reasons, the manual generation of the image pickup recipe has been becoming unrealistic.

Then, on the basis of design information of semiconductor circuit design data representing design information of patterns on the wafer in FOV's at low magnification, an image pickup recipe is so generated as to include part or all of image pickup parameters of (a1) the number of points, (a2) coordinate values and (a3) size/shape of image pickup points for observation of EP (AP, AFC, AST and ABCC), (a4) the image pickup sequence (inclusive of the image pickup order of EP and image pickup point and the electron beam vertical incident coordinate), (a5) the image pickup position changing method (stage shift, beam shift), (a6) the image pickup condition (probe current, accelerating voltage, the scan direction of electron beam and so on) and (a7) the image pickup sequence or evaluation value or preferential order of template. Further, preferably, the image pickup recipe is applied to a semiconductor inspecting system which registers the aforementioned image pickup parameters and the template such as AP template.

Preferably, input information for generation of the image pickup recipe includes any or all of (b1) evaluation point information represented by coordinate value, size/shape of EP and image pickup condition, (b2) design pattern information represented by CAD data of EP neighborhood (inclusive of layer information), information of residual mask data removed of pattern, line width information of pattern, the kind of a wafer to be image-picked up, processes and material information of pattern and under coating, (b3) process parameters of image pickup recipe automatic generation engine including search range of image pickup points (AP, AF, AST, ABCC), necessary conditions for selecting element index value the image pickup points must satisfy (given by threshold value of the index value), selection element index preferential order (given by, for example, weight between index values), an inhibition region not to be selected as image pickup point, a shape overlay/separation presumptive amount and device condition (stage shift range, stage shift/beam shift presumptive error), (b4) the user request specification including accuracy of requested positioning of image pickup positions for individual image pickup points, requested picture quality (inclusive of focus tuning, stigma adjustment, brightness/contrast adjustment, request concerning contamination and request concerning permissible electron beam incident angle at EP) and requested image pickup time, and (b5)

hysteresis information (information of an image pickup point which succeeded or failed in image pickup in the past and so on).

Further, in addition to the aforementioned input information (b1) through (b5), values of part of the aforementioned output information (image pickup parameter) (a1) through (a7) or default value/settable range can be provided as input information. In other words, there is available the function to record, out of (a1) through (a7) and (b1) through (b5), a combination of arbitrary parameters as input information and out of (a1) through (a7), a combination of arbitrary parameters as output information.

On the other hand, when generating an image pickup recipe used for sequentially image-picking up a plurality of critical dimension measurement points on the sample by using the scanning electron microscope, problems as below are conceivable.

Firstly, in order for the workmanship of a finished semiconductor pattern at an EP to be inspected, an image pickup recipe for image-picking up the EP must be prepared but with the semiconductor pattern rendered corpuscular, the number of EP's to be inspected increases, giving rise to a problem that the preparation of the image pickup recipe requires drastically much labor and time. The previously described Patent Literature 1 describes the case that EP coordinate value/size and image pickup condition are given manually by the SEM operator, failing to take up reduction in work time of the SEM operator.

<As to EP Arrangement Process (Overall Outline)>

A process will be described hereinafter in which with the aim of improving the throughput of the scanning electron microscope, EP's to be registered in the image pickup recipe are so arranged that ranges analyzable for electric characteristics are all covered on the basis of a device designated in advance as an objective to be observed.

Outline of an expedient for setting EP's (FOV's adapted for measurement) on the basis of a device designated in advance will be described as below.

More specifically, in the recipe preparing method, an image pickup recipe for observing EP's is generated on the basis of a device selected in advance on CAD data. As output information, (a1) coordinate values (positions), (a2) the number and (a3) size/shape of evaluation points EP's covering the whole of device shape within an image pickup range for observing EP's are calculated automatically and registered in the image pickup recipe. Also, as input information, a combination of arbitrary parameters of (b1) critical dimension measuring point information represented by device constituent information (coordinate, linking information, figure information) and contour extraction parameter, (b2) user request specifications represented by EP size of default and (b3) the presence/absence of optimization of the EP size is used and a combination of arbitrary parameters (a1) through (a3) is used as output information.

According to the method described as above, the following advantageous effects can be obtained. More particularly, by verifying electric characteristics of a device required of the stringently accurate high pairing property and of a critical pulse portion which are required of the stringent accuracy of finished pattern because high signal transmission accuracy is demanded in circuit operation, contribution to early finding of a faulty portion which is free from deposition of contaminant and finished to a shape close to design data at a glance but is responsible for operational abnormality can be achieved in the fabrication process. Further, without intervention by the SEM operator, generation of contamination at an EP can be suppressed and therefore, highly accurate image pickup recipe can be generated within short time periods.

FIG. 4 is a diagram showing the outline of the whole of procedures (example) of an image pickup recipe generation process including EP setting explained as above. As shown in FIG. 4, input information includes evaluation device information 401 including name of an element to be measured and network number (wiring number), CAD data 402 and various parameters 403 such as contour extraction parameter and the like. Included in output information are EP coordinate and size information 410 and image pickup sequence 411.

Then, the evaluation point automatic engine 404 sets an image pickup point search range on the basis of the input information (405) and subsequently, executes EP coordinate/size and image pickup sequence calculation (406). The procedure 406 includes a process 407 for dividing the image pickup point by constituent figures the database 412 holds, an EP coordinate optimizing process 408 for arranging FOV's to the constituent figures and an image pickup sequence optimizing process 409. To add, in the process 208, a size designated by the user may be used for the FOV size optimizing process or the FOV may be determined on the basis of a width of a wiring figure.

Subsequently, the EP coordinate/size, image pickup sequence, input information and output information are registered as an image pickup recipe (413). Then, image pickup is carried out actually on the basis of the image pickup recipe (414) and an obtained image is decided as to whether to be satisfactory or not (415). If satisfactory, the program ends but if unsatisfactory, the program is switched to another image pickup point or image pickup sequence and an image pickup process is retried.

<As to EP Arrangement Process (Details)>

A process for automatically determining the position of an EP (the FOV size may be included) will hereinafter be described in detail. By automating determination of the position of an EP including a device the electric characteristics of which were needed to be verified manually, the time to generate a recipe can be reduced and the total throughput inclusive of preparing the SEM for image pickup operation can be improved, leading to improvements in SEM operability.

FIG. 5 is a diagram showing the input information and output information in the EP (FOV) arrangement process. It is to be noted that reference numerals in FIG. 5 differ from those in FIG. 4 because FIG. 5 is specified to the EP arrangement process and in this sense, different reference numbers are used.

Figure 6A:
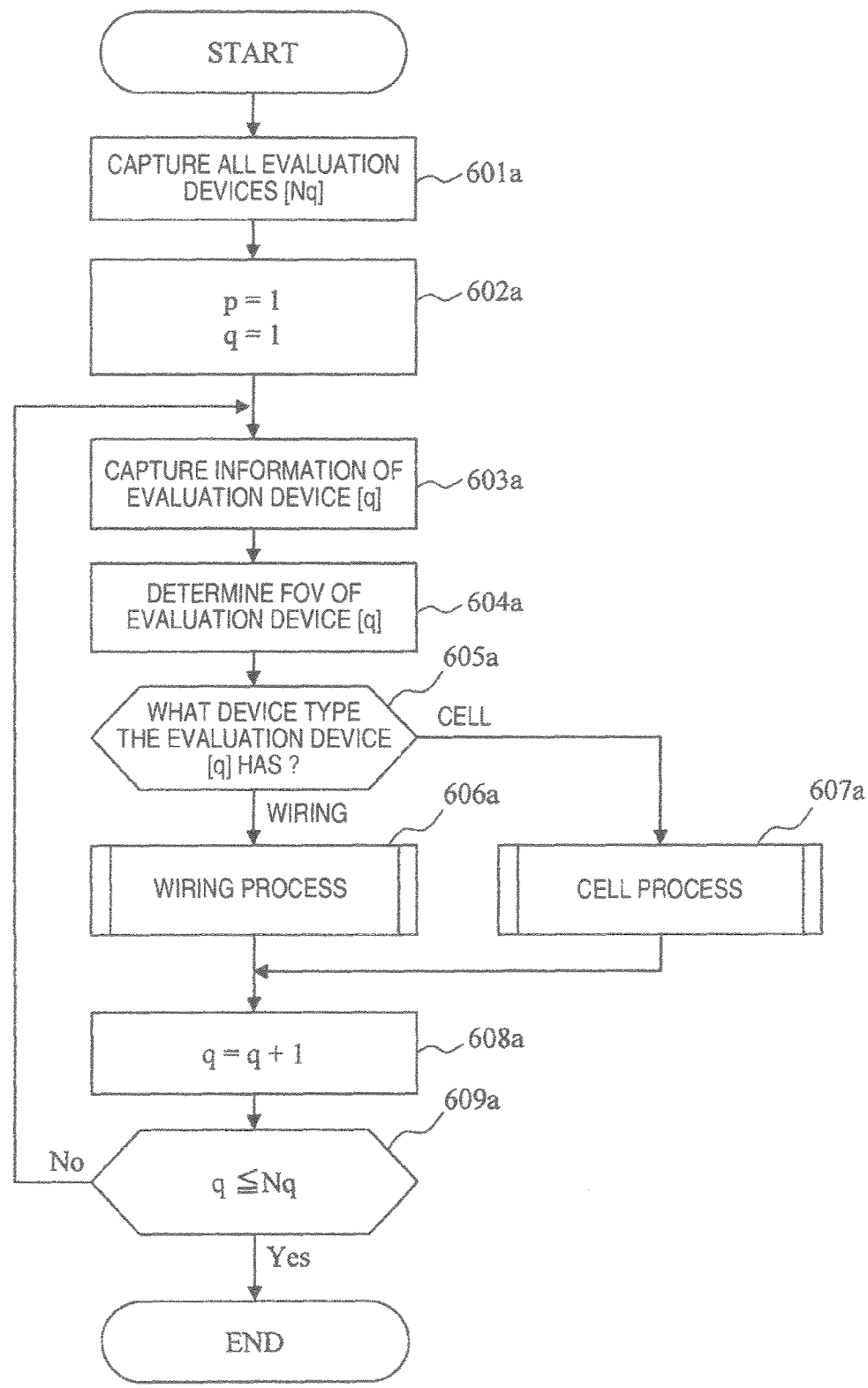
FIG. 6A is a flowchart for explaining a process of allotting FOV's to all designated devices.
Figure 8:
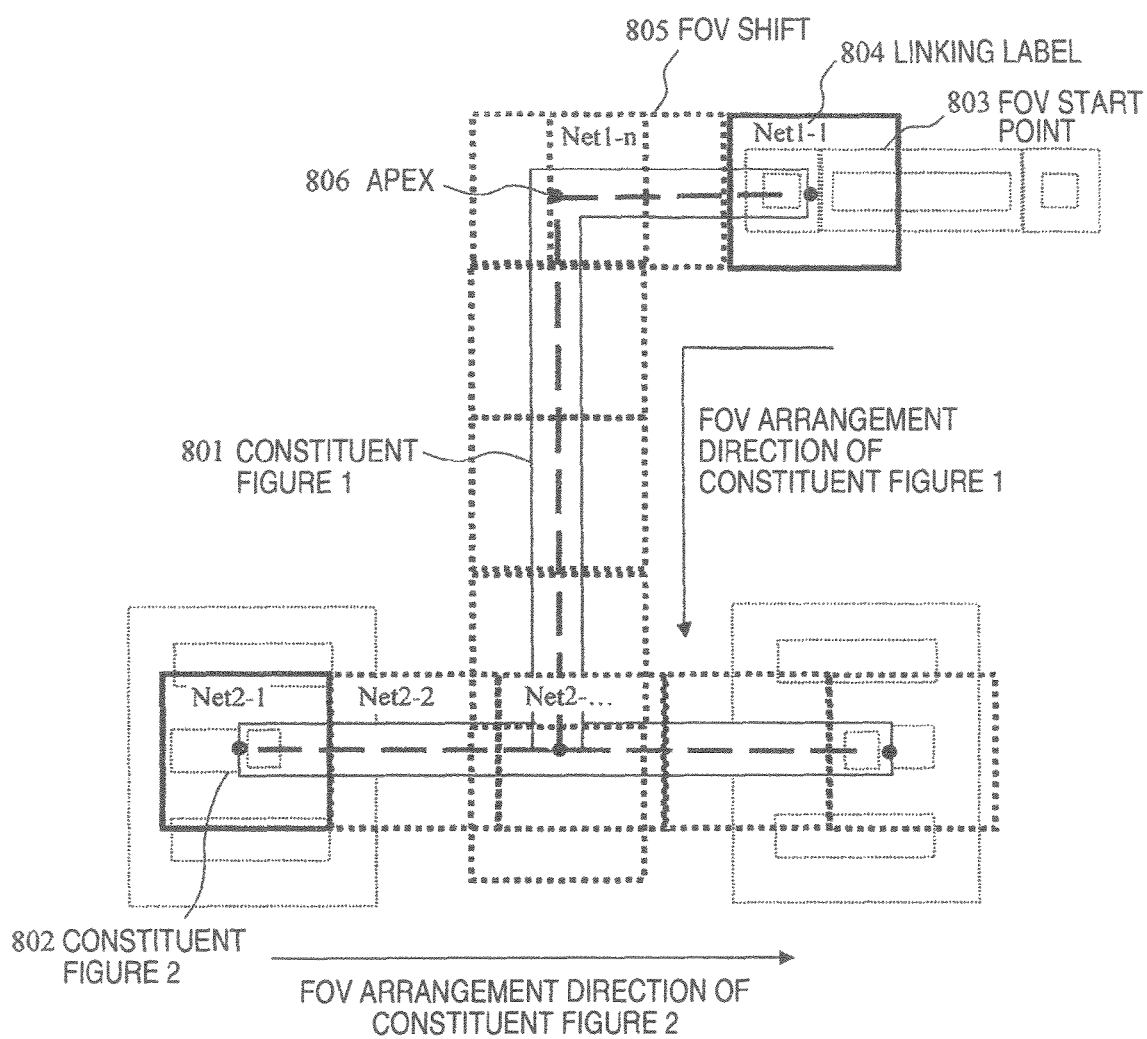
FIG. 8 is a diagram showing an example of a process of allotting FOV's to wiring devices.
Figure 9:
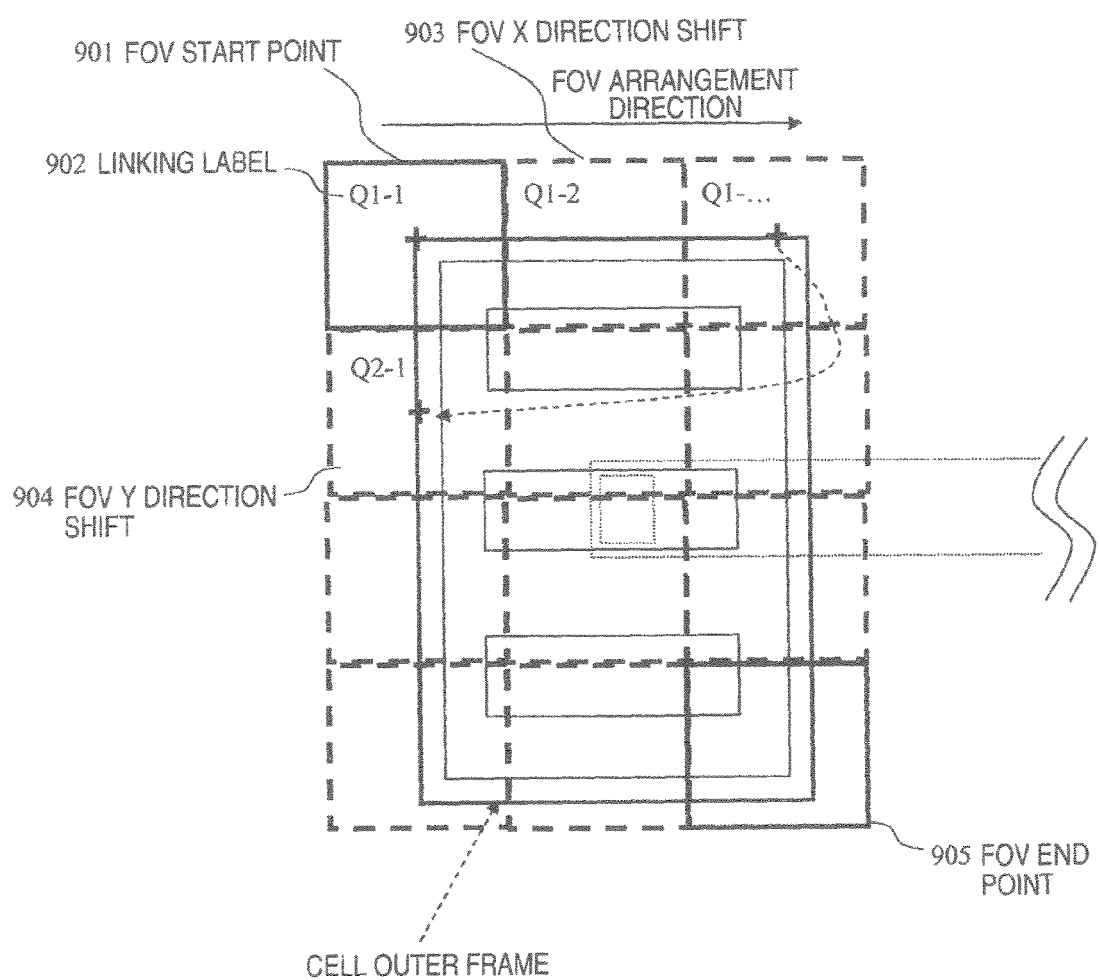
FIG. 9 is a diagram showing an example of a process of allotting FOV's to cell devices.
Figure 10:
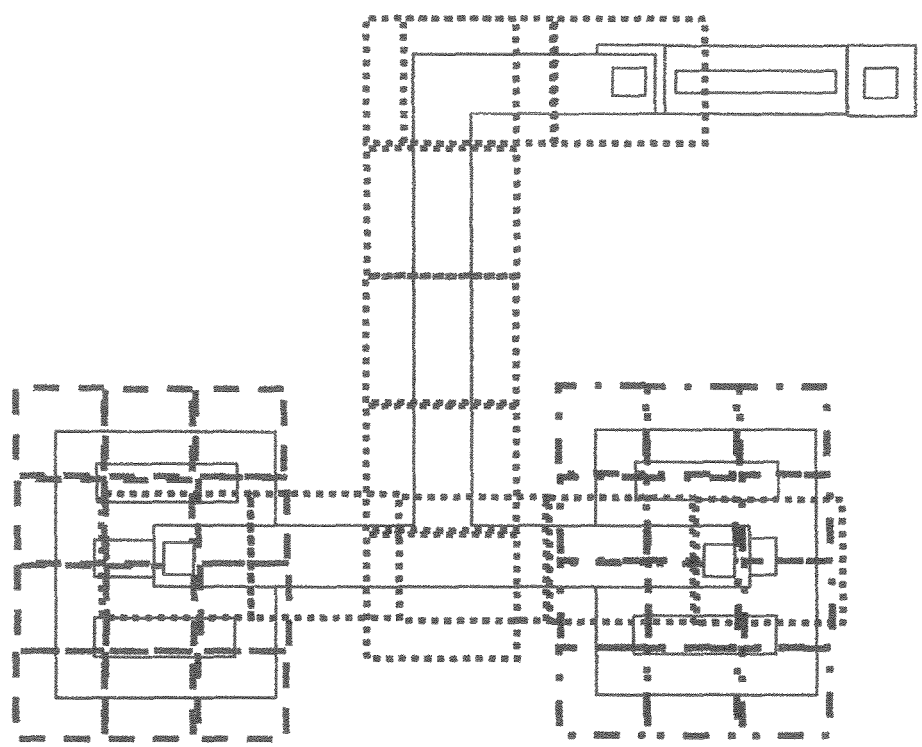
FIG. 10 is a diagram showing results (examples) obtained by the process of allotting FOV's to all evaluation devices.

FIGS. 6A through 6C are flowcharts for explaining details of the SP arrangement process. FIG. 7 is a diagram showing the correspondence between circuit design data and layout design data in an evaluation device (example). FIGS. 8 and 9 are diagrams for explaining a status of allotment of FOV's. FIG. 10 is a diagram showing the results of the EP arrangement process.

(1) As to Input/Output Information

In explaining the image pickup recipe with reference to FIGS. 3A and 3B, an example of information to be registered in the image pickup recipe is given in reference to a set of EP, AP, AF, AST and ABCC. In FIG. 5, the contents of information necessary for evaluation point automatic generation and information outputted as a recipe are exemplified especially. In the figure, pieces of information 502 to 506 positioned at ends of arrows (generally exemplified at 513) extending to the evaluation point automatic generation engine (sometimes simply referred to as "engine" hereinafter) 501 indicate input information to the engine 501. Further, pieces of information 507 through 512 positioned at ends of links (generally exemplified at 514) connected at black circle to the engine 501 indicate that they can be either input information or output information.

Namely, the engine is featured in that it can calculate an arbitrary combination of the pieces of information 502 through 506 or 507 through 512 as input information and an arbitrary combination of the pieces of information 507 through 512 as output information and can output them. Besides, an arbitrary combination of the pieces of information 502 through 506 or 507 through 512 can be excluded as pieces of information unnecessary for any of the input and output information.

In addition, the method for selecting an arbitrary combination of the pieces of information 502 through 506 or 507 through 512 to provide the input information and the method for the engine 501 to calculate the output information can be subjected to at least two variations to be described below. For each of the input information and the output information, one of these variations can be selected.

(i) In the first place, a method is available in which the user designates a fixed value of input information as input information or a default value prepared in advance in database 515, for example, is set as input information. On the presumption of the fixed value or the default value, the engine 501 calculates an arbitrary output value. Further, the input information can be included in the output information. In this case, the engine 501 recalculates a proper value of input information on the basis of the input information and outputs it.

(ii) In the second place, a method is available in which the user sets a range of acquirable values of input information or sets a default value within a range acquirable by the input information prepared in advance in the database 515, for instance. On the presumption that the input information is changeable within the range, the engine 501 calculates arbitrary output information. In this case, too, the input information can be included in the output information. In this case, the engine 501 calculates a proper value of input information within the range of values acquirable by the inputted input information and outputs it.

(2) As to Detailed Contents of Input/Output Information

Next, detailed contents of the pieces of input/output information 502 through 512 will be described.

(i) Contents of Information Impersonating Input Information

As information 502 of evaluation point, evaluation device information [q] 503 and parameter information 504 of evaluation point are available. Here, arrangement number q indicates ID's of a plurality of evaluation devices selected on the CAD data (q=1~$N_q$, $N_q \geq 1$).

Also, as user request specifications 505, size/shape 506 of an evaluation point EP [p] is available. Here, arrangement number p indicates ID's of a plurality of evaluation points on the chip mounted on the wafer (p=1~$N_p$, $N_p \geq 1$). Generally, the evaluation point is shaped in the form of a square area or a rectangular area but another arbitrary shape may also be set as an image pickup range.

(ii) The Contents of Information Impersonating Input Information or Output Information Used as the evaluation point information 508 are a coordinate value 509 of evaluation point EP [p], a size 510 of evaluation point EP[p], an EP[p] linking label 511 and an image pickup sequence (image pickup order and the like) 512. The image pickup sequence 512 is for designating what order the aforementioned EP[p] is image-picked up in or how various processes are dealt with.

Then, the database 515 holds/manages part or all of the previously-described pieces of information 502 through 512. The aforementioned information can be handled in common as information prevailing between time series or between different SEM devices. In addition, the evaluation point automatic generation engine 501 can read, as necessary, arbitrary information from the database 515 and reflect it upon various processes. Further, when determining values or ranges of various pieces of input information 502 through 512, old parameters saved in the database 512 can be consulted or various input information values or default values of range can be saved in respect of kinds or individual fabrication processes.

(3) Evaluation Point Automatic Generation Sequence

FIGS. 6A to 6C are flowcharts for explaining details of the whole evaluation point automatic generation process.

Firstly, in step 601*a*, the engine 501 captures from the CAD data an evaluation device [Nq] designated by the user or automatically designated by critical path information resulting from Hot Spot extraction or timing analysis. Examples of measurement devices designated on the CAD data are illustrated in FIGS. 7A and 7B.

Figure 7A:
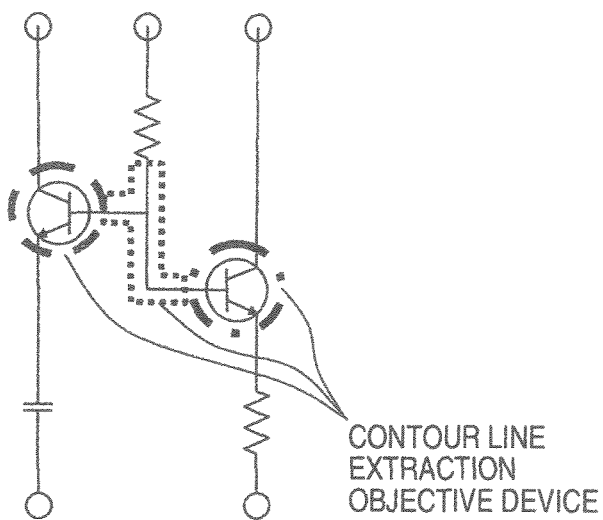
FIG. 7A is a diagram showing an example of selecting evaluation devices on circuit design data.
Figure 7B:
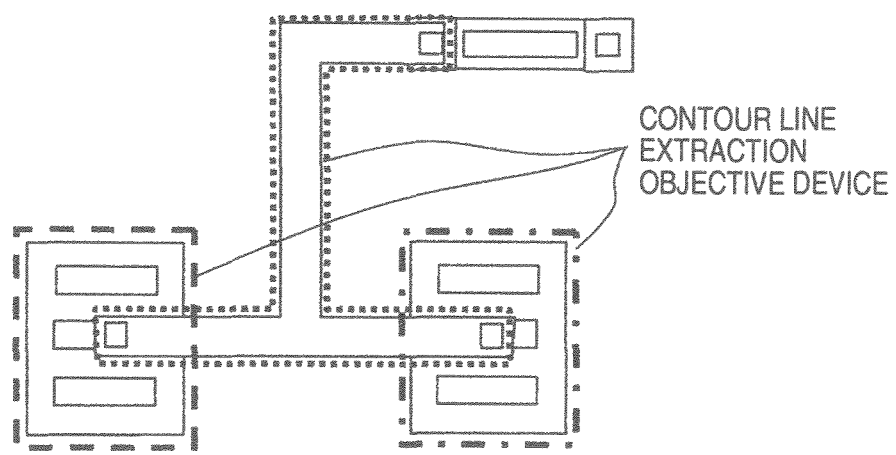
FIG. 7B is a diagram showing an example of evaluation devices on layout design data.

FIG. 7A shows an example of evaluation devices designated on circuit design data also in the CAD data and FIG. 7B shows an example of evaluation devices designated on layout design data also in the CAD data. The circuit design data and layout design data are related to each other and they can be collated with each other in terms of LVS (Layout Versus Schematic). Accordingly, by collating the critical path extracted by timing analysis with the layout design data, a device required of evaluation on the actual devices can be identified and by feeding the result of measurement on the actual devices back to the circuit design data, electric characteristics and timing can be analyzed. In other words, which portion on the layout design data corresponds to wiring can be identified.

Next, in step 602*a*, the engine 501 initializes an evaluation point ID [p] and an evaluation device ID [q]. Also, the engine 501 fetches, in step 603*a*, figure information of the evaluation device [q] representing a base point from the CAD data. It should be understood that through steps 603*a* to 609*a*, evaluation points of all evaluation devices are generated.

In step 604*a*, the engine 501 determines an EP-FOV magnification applicable to the evaluation device [q]. This magnification can be calculated from a minimal one of the evaluation device constituent figures (for example, a square having a side k times a width of the minimal constituent figure is set as an FOV) or can be designated in advance device by device by the user.

In step 605*a*, the engine 501 examines the device type of evaluation device [q] on the basis of the CAD data and branches the procedure depending on whether the type is wiring or cell.

When the evaluation device [q] is wiring, the engine 501 executes processes of steps 601*b* to 612*b* (FIG. 6B) (details will be described later) and in the case of a cell, the engine 501 executes processes of steps 601*c* to 607*c* (FIG. 6C) (details will be described later).

When the wiring process (step 606*a*) or the cell process (step 607*a*) ends, the engine 501 decides, in steps 608*a* and 609*a*, whether an evaluation device to be processed next is present and if present, the program returns to the step 603*a* but if absent, the program ends.

(i) Details of Wiring Process (FIG. 6B)

FIG. 6B is a flowchart for explaining details of the wiring process (step 606*a*).

In step 601*b*, the engine 501 captures constituent wiring elements (figures) of an evaluation device [q] as indicated by [Nr]. This is because, on the CAD data, wiring devices are registered as single line segment information in respect of individual branches as shown at 801 and 802 in FIG. 8.

In step 602b, the engine 501 initializes a wiring element ID [r]. Further, in step 603b, the engine 501 captures apex information [Ns] of the wiring element [r]. For example, as shown in FIG. 8, information of apex [•] is obtained. Then, in steps 603b through 612b, evaluation points including all of the wiring elements are generated.

In step 604b, the engine 501 initializes an apex number ID [s] in respect of the apex obtained in the step 603b.

In step 605b, the engine 501 saves an EP-FOV centered on the apex [s] representing a base point at an evaluation point [p] by adding a label capable of linking later. In FIG. 8, an EP-FOV arrangement example 803 and an example of label 804 are illustrated. Also, in the example of FIG. 8, a right above apex is set to a start point.

The engine 501 increments the apex number ID [s] in step 606b and increments the evaluation point [p] in step 607b. By doing so, the engine 501 decides which direction the next apex resides in (decision of apex direction).

Next, in step 608b, the engine 501 repeats the steps 606b through 610b until all apexes of wiring element [r] have been processed.

In step 609b, the engine 501 decides whether an apex [s] (the next apex) is included in the EP-FOV (because if the next apex is included in the FOV, the arrangement direction is to be changed) and if not included, in step 610b, an EP-FOV [p] shifted in a direction of apex [s] so as not to overlap the EP-FOV [p−1] is related to a label capable of linking later (added with the label) and saved.

The above process (steps 603b through 610b) is executed for all of the wiring elements (constituent figures) (step 611b and 612b).

(ii) Details of Cell Process (FIG. 6C)

FIG. 6C is a flowchart for explaining details of the cell process.

In step 601c, the engine 501 captures left above and right below apex coordinate values of a cell outer frame of an evaluation device [q] and determines the arrangement direction of the FOV. It will be appreciated that in FIG. 9, the arrangement direction extends from left to right.

In step 602c, the engine 501 saves an EP-FOV centered on a left above apex representing a base point by relating to a label capable of linking later (adding the label). In FIG. 9, an EP-FOV arrangement 901 (example) and a label 902 (example) are illustrated.

In step 603c, the engine 501 increments the evaluation point [p]. This ensures that evaluation points including all cell regions can be generated through steps 604c through 607c.

In step 604c, the engine decides whether the EP-FOV includes the right side of cell outer frame. If not included, the program proceeds to step 605c but if included, the program proceeds to step 606c.

In step 605c, the engine 501 arranges the EP-FOV shifted to the right side of cell outer frame so that the EP-FOV may not mutually overlap as shown at FOV_X direction shift 903 in FIG. 9 and saves the shifted EP-FOV by relating it to a linking label (by adding the label).

In step 606c, the engine 501 arranges the shifted EP-FOV to the lower side of cell outer frame so that the EP-FOV may not mutually overlap as shown at FOV_Y direction shift 904 in FIG. 9 and saves the shifted EP-FOV by relating it to a linking label (by adding the label). To add, in step 606c of FIG. 6C, a work FOV is an FOV arranged firstly in the array, meaning that the FOV is a FOV to which other FOV's are to be referenced. In the example of FIG. 9, this is a leftmost FOV. Namely, an FOV_Q1-1 remains as work FOV until an FOV_Q2-1 on the next array is determined.

In step 607c, the engine 501 decides whether the EP-FOV includes the right below apex of cell outer frame and repeats the procedure in steps 603c through step 607c until it is included.

(iii) Status after FOV Arrangement Process

FIG. 10 is a diagram showing the status after the FOV's are arranged. By carrying out the FOV arrangement process according to the present invention as shown in FIG. 10, the FOV can be arranged properly in accordance with wiring and cell and besides, the mutually overlapping area of FOV's can be minimized.

The foregoing description has been given by way of the embodiments but the invention is not limited thereto and it is obvious to those skilled in the art that the present invention can be altered and modified variously without departing from the spirit of the invention and within the scope of the appended claims.

Industrial Applicability

In the present invention, the image acquisition condition for arranging all constituent areas necessary for measurement of electric characteristics can be determined from the device shape information (inclusive of circuit design data and layout design data) the CAD data has such that they can be confined in FOV's, with the FOV's not mutually overlapping along the device shape. This ensures that the user can be freed from manually inputting a portion having electric characteristics and therefore, a portion to be inspected for circuit operation can be extracted easily.

Since the wiring portion of device can be expressed, contingently upon its shape, by using a plurality of basic constituent figures in combination, the process of arranging an FOV for each constituent figure is executed. As to the cell portion, an FOV is arranged with referenced to a cell outer frame and apexes. At that time, any apex impersonates a start point of FOV arrangement process and another apex impersonates an end point of the process. After the portions having electric characteristics (wiring portion and cell portion) have been specified, a portion required of measurement is expressed by using the basic constituent figures in combination (a plurality of kinds of basic constituent figures are stored in the database) and so, FOV's can be arranged very easily. Accordingly, the time to generate an evaluation point can be shortened and the throughput of recipe generation process can be upgraded.

To add, the wiring portion and cell portion in the evaluation device can be identified by collating (LVS) the circuit design data with the layout design data which are included in the CAD data. In this manner, full use of the CAD data can be made and therefore, information for extracting a portion having electric characteristics need not be generated newly.

Further, to the FOV arranged at a portion to be measured on the evaluation device is given a label indicating the image pickup order. This permits the image pickup sequence to be clarified.

Furthermore, since the status of the arrangement of FOV's obtained as a result of the arrangement process of evaluation points (FOV's) is displayed on the display unit, the user can visually understand with ease where a portion to be measured is.

REFERENCE SIGNS LIST

100 Scanning electron microscope
115 Process/control unit (computer system)
404, 501 Evaluation point automatic generation engine 412, 515 Database
401, 503 Evaluation device information storage
402, 503 CAD data storage
403, 504 Evaluation point parameter information storage
509 EP coordinate information storage
510 EP size information storage
511 EP linking label information storage
512 Image pickup sequence information storage

The invention claimed is:

1. A scanning electron microscope device for irradiating an electron beam on an evaluation point on an evaluation device and capturing an image of the evaluation point, comprising:
an input unit for inputting CAD data of said evaluation device;
an evaluation point generation unit for determining an evaluation point of said evaluation device on the basis of said CAD data; and
an output unit for outputting information of said evaluation point determined by said evaluation point generation unit, wherein
said evaluation point generation unit identifies a wiring portion and a cell portion on said evaluation device on the basis of said CAD data, determines a FOV (Field Of View) corresponding to said evaluation point in respect of the identified portion, and arranges the determined FOV at said identified portion.

2. A scanning electron microscope device according to claim 1, wherein said evaluation point generation unit identifies said wiring portion and said cell portion by collating circuit design data with layout design data, both included in said CAD data.

3. A scanning electron microscope device according to claim 2 further comprising a basic constituent figure database for storing a plurality of kinds of basic constituent figures constituting the device, wherein
said evaluation point generation unit extracts basic constituent figures said layout design data has by consulting said basic constituent figure database,
identifies, for said wiring portion, a plurality of apexes of basic constituent figures constituting the wiring portion, and determines a first apex and a second apex at which arrangement of FOV's starts and ends, respectively, and
arranges said FOV's in a direction of from said first apex to said second apex in such a manner that an mutually overlapping area of FOV's is minimized.

4. A scanning electron microscope device according to claim 3, wherein in respect of the cell portion, said evaluation point generation unit identifies, from a cell contour, a start apex representing a FOV arrangement start point and an end apex representing a FOV arrangement end point, and arranges FOV's in sequence from the start apex toward the end apex in such a manner that alternate FOV's do not overlap mutually.

5. A scanning electron microscope device according to claim 3, wherein when said wiring portion is constituted by a plurality of basic constituent figures, said evaluation point generation unit determines said first and second apexes in respect of each of the basic constituent figures and then arranges FOV's.

6. A scanning electron microscope device according to claim 1, wherein said output unit includes a display processor for displaying a status of the arrangement of said FOV's on said evaluation device when said FOV arrangement process is finished.

7. A scanning electron microscope device according to claim 1, wherein said evaluation point generation unit applies to each of said arranged FOV's a label indicative of the order of image-pickup.

8. An evaluation point generating method in a scanning electron microscope device for irradiating an electron beam on an evaluation point on an evaluation device and capturing an image of the evaluation point, comprising the steps of:
capturing CAD data of said evaluation device inputted from an input unit;
causing an evaluation point generation unit to determine an evaluation point of said evaluation device on the basis of said CAD data; and
causing an output unit to output information of said evaluation point determined by said evaluation point generation unit, wherein
in said evaluation point determining step, said evaluation point generation unit identifies a wiring portion and a cell portion on said evaluation device on the basis of said CAD data, determines a FOV (Field Of View) corresponding to said evaluation point in respect of the identified portion, and arranges the determined FOV at said identified portion.

9. A computer-readable storage medium storing a computer program for carrying out the evaluation point generating method as recited in claim 8.

* * * * *